(12) United States Patent
Uchida et al.

(10) Patent No.: US 8,310,034 B2
(45) Date of Patent: Nov. 13, 2012

(54) SEMICONDUCTOR DEVICE

(75) Inventors: Shinichi Uchida, Kanagawa (JP);
Takasuke Hashimoto, Kanagawa (JP);
Masayuki Furumiya, Kanagawa (JP);
Kimio Hosoki, Kanagawa (JP); Hideo Ohba, Kanagawa (JP)

(73) Assignee: RENESAS Electronics Corporation, Kawasaki-shi, Kanagawa (JP)

( * ) Notice: Subject to any disclaimer, the term of this patent is extended or adjusted under 35 U.S.C. 154(b) by 253 days.

(21) Appl. No.: 12/801,076

(22) Filed: May 20, 2010

(65) Prior Publication Data
US 2010/0314727 A1  Dec. 16, 2010

(30) Foreign Application Priority Data
Jun. 16, 2009  (JP) ................................ 2009-142973

(51) Int. Cl.
*H01L 23/00* (2006.01)
*H01L 23/48* (2006.01)

(52) U.S. Cl. .. 257/659; 257/773; 257/776; 257/E23.114

(58) Field of Classification Search .................. 257/659, 257/773, 776, E23.114
See application file for complete search history.

(56) References Cited

U.S. PATENT DOCUMENTS

| 6,995,450 | B2 | 2/2006 | Yamamoto | |
|---|---|---|---|---|
| 7,550,850 | B2 | 6/2009 | Nakashiba | |
| 2004/0150070 | A1* | 8/2004 | Okada et al. | 257/508 |
| 2004/0212039 | A1 | 10/2004 | Yamamoto | |
| 2005/0212071 | A1 | 9/2005 | Yue et al. | |
| 2006/0102980 | A1 | 5/2006 | Nakashiba | |
| 2006/0244133 | A1* | 11/2006 | Chen et al. | 257/728 |
| 2008/0169509 | A1 | 7/2008 | Tanaka | |
| 2009/0250783 | A1 | 10/2009 | Nakashiba | |

FOREIGN PATENT DOCUMENTS

| JP | 1-103859 A | 4/1989 |
|---|---|---|
| JP | 2004-327941 A | 11/2004 |
| JP | 2006-147668 A | 6/2006 |
| JP | 2007-531281 A | 11/2007 |
| JP | 2008-71931 A | 3/2008 |
| JP | 2008-177246 A | 7/2008 |
| WO | WO 2005/098937 A1 | 10/2005 |

* cited by examiner

*Primary Examiner* — Peniel M Gumedzoe
(74) *Attorney, Agent, or Firm* — McGinn IP Law Group, PLLC

(57) ABSTRACT

A semiconductor device having a digital region and an analog region embedded therein has an annular seal ring which surrounds the outer circumference of the digital region and the analog region in a plan view; a guard ring which is provided in the area surrounded by the seal ring, between the digital region and the analog region, so as to isolate the analog region from the digital region, and so as to be electrically connected to the seal ring; and an electrode pad which is electrically connected to the guard ring in the vicinity of the guard ring.

21 Claims, 9 Drawing Sheets

SEMICONDUCTOR DEVICE

This application is based on Japanese patent application No. 2009-142973, the content of which is incorporated hereinto by reference.

BACKGROUND

1. Technical Field

The present invention relates to a semiconductor device having a digital region and an analog region embedded therein.

2. Background Art

Semiconductor device has a protective structure called seal ring, which is provided around the circumference of the element forming region, having circuits formed therein, for the purpose of protecting the element forming region from influences of external moisture or the like. The seal ring is formed over the entire layers of a multi-layered interconnect structure over a substrate. The seal ring is formed using an electroconductive film mainly composed of copper, for example, similarly to interconnects and vias formed in the element forming region.

Japanese Laid-Open Patent Publication No. 2008-177246 describes a structure in which guard rings (seal rings) are connected to the ground potential, via contacts and impurity-diffused layers over a substrate. The document describes a technique of appropriately arranging the contacts, in order to suppress operation of parasitic bipolar element otherwise possibly formed by a plurality of guard rings.

Japanese Laid-Open Patent Publication No. 2008-071931 describes a semiconductor device which has a semiconductor chip having an element forming region and a peripheral region formed so as to surround the element forming region, a plurality of metal rings composed of a stack of a plurality of metal layers concentrically formed over the peripheral region of the semiconductor chip, and a stack of a plurality of interconnect layers formed over the element forming region. In a region of an interconnect layer out of the stacked plurality of interconnect layers, neighboring the innermost metal ring (seal ring) out of the plurality of metal rings, a stack of interconnect layers electrically connected in the vertical direction is formed, and the stack of the interconnect layers and the innermost metal ring serve as a pair of electrodes which configure a capacitor having a predetermined potential difference. The stack of the interconnect layers is connected to the source potential, and the innermost metal ring is connected to the ground potential. According to the description, a chip size of a semiconductor device which needs a large capacitor may be reduced.

Published Japanese Translation of PCT International Publication for Patent Application No. 2007-531281 describes that a separated guard ring is connected through a chip metal to a grounding lead wire (paragraph 0033), and that the separated guard ring is connected through the chip metal to a bonding pad which is coupled to the off-chip ground potential (paragraph 0034).

Japanese Laid-Open Patent Publication No. 2004-327941 describes a configuration in which a ring-shape $p^{30}$-type diffusion region is formed so as to surround an internal circuit on a surface of a P-type substrate and a shunt interconnect is formed in a region containing a right-above region of the $p^+$-type diffusion region on the P-type substrate. The shunt interconnect is connected through a plurality of contacts to the $p^+$-type diffusion region. The shunt interconnect is provided with an annular ring portion which surrounds the internal circuit, and a meander inductor drawn out from the ring portion. One end of the meander inductor is connected to the ground potential interconnect GND, and thereby an oscillation circuit is formed by a contribution of parasitic capacitance ascribable to the P-type substrate and the $p^+$-type diffusion region opposed with the shunt interconnect, and inductance of the shunt interconnect. The description describes that with this structure, a desired frequency component may selectively be removed from substrate noise.

Japanese Laid-Open Patent Publication No. H01-103859 describes that a guard ring (seal ring) is applied with the ground potential.

SUMMARY

By the way, in a semiconductor device having, in an element forming region over a substrate, a digital region having digital circuits formed therein and an analog region having analog circuits formed therein are embedded, noise generated in the digital region may propagate through the seal ring to the analog region, and may induce malfunction of elements provided to the analog region (Japanese Laid-Open Patent Publication No. 2006-147668). The noise may propagate also through the substrate.

While the techniques of grounding the seal ring have conventionally been known, the conventional methods have only achieved insufficient level of reduction of noise propagation in the semiconductor devices having the digital region and the analog region embedded therein. Investigations by the present inventors have revealed that the noise propagation to the analog region cannot fully be reduced merely by grounding the seal ring which surrounds the element forming region containing the digital region and the analog region, in particular for the case where the digital region deals with high-frequency signals. This is supposedly because influence of a noise component which propagates through the substrate grows to a larger degree, when high-frequency signals are dealt with.

According to the present invention, there is provided a semiconductor device having a digital region and an analog region embedded therein, including:

a substrate;

an insulating interlayer formed over the substrate;

an annular seal ring being composed of a first electro-conductive film embedded in the insulating interlayer, and surrounding the outer circumference of the digital region and the analog region in a plan view;

a guard ring being composed of a second electro-conductive film embedded in the insulating interlayer, provided in the area surrounded by the seal ring, between the digital region and the analog region, so as to isolate the analog region from the digital region, and so as to be electrically connected to the seal ring; and a first electrode pad being electrically connected to the guard ring in the vicinity of the guard ring.

According to this configuration, since the guard ring which isolates the analog region from the digital region is provided between the digital region and the analog region, so that noise otherwise possibly propagates from the digital region to the analog region may be dissipated, even when high-frequency signals are dealt with. Accordingly, influences of noise generated in the digital region and is possibly be exerted to noise-susceptible circuit may be reduced, and thereby the characteristics of the circuit are prevented from degrading.

For example, when the first electrode pad is set to the ground potential, since the first electrode pad is electrically connected to the guard ring in the vicinity thereof and also the guard ring is set to the ground potential. By virtue of the electrical connection with the guard ring, so that influences of the noise otherwise possibly propagates through the seal ring may be dissipated to the ground at a low impedance through the guard ring, even when high-frequency signals are dealt with and may be further effectively reduced.

It is to be understood that also any arbitrary combination of the above-described constituents, and any exchange of expressions of the present invention among method, device and so forth, may be valid as embodiments of the present invention.

According to the present invention, in the semiconductor device having the digital region and the analog region embedded therein, the noise otherwise possibly propagates from the digital region to the analog region may effectively be suppressed.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1:
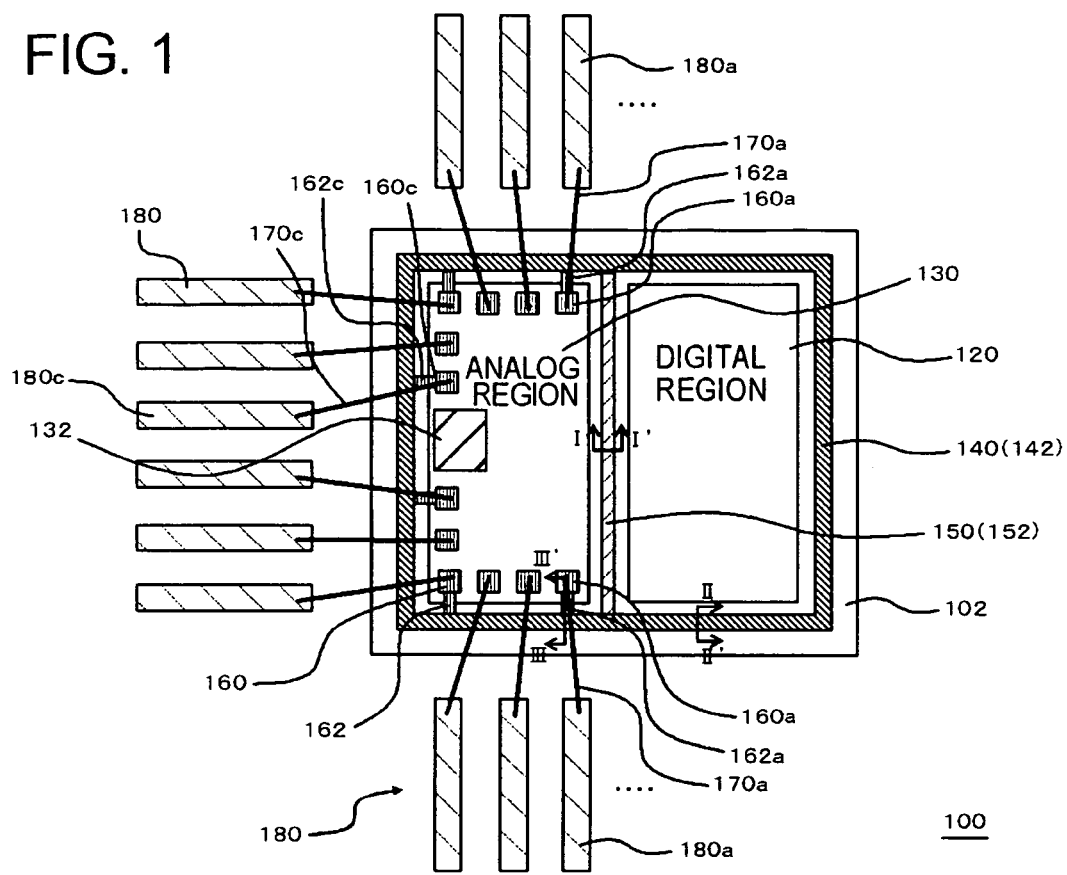
FIG. 1 is a plan view illustrating an exemplary configuration of a semiconductor device in one embodiment of the present invention.

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Embodiments of the present invention will be explained referring to the attached drawings. Note that all similar constituents will be given similar reference numerals or symbols in all drawings, and relevant explanations will not always be repeated.

Figure 2:
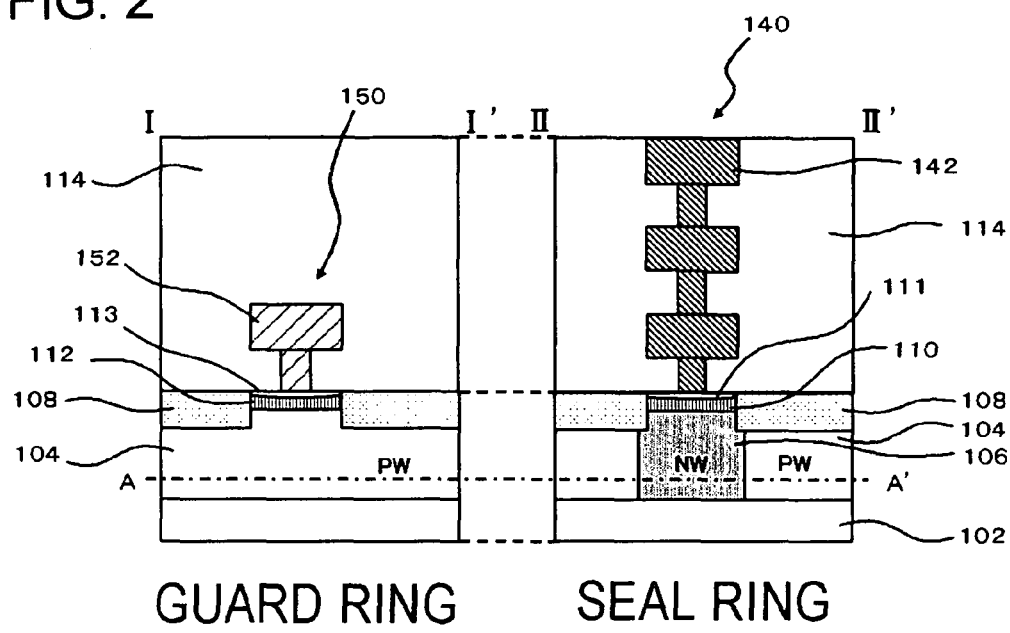
FIG. 2 is a sectional view illustrating an exemplary configuration of the semiconductor device according to the embodiment of the present invention.

FIG. 1 is a plan view illustrating the semiconductor device of this embodiment. FIG. 2 is a sectional view illustrating sections taken along line I-I' and line II-II' in FIG. 1.

A semiconductor device 100 may be configured to have a digital region 120 and an analog region 130. The digital region 120 herein may be configured as a region having logic circuits formed therein. In this embodiment, the digital region 120 may be configured typically as a region where signals of approximately $10^8$ Hz or higher frequencies are dealt with. The analog region 130 may be configured as a region having analog circuits formed therein. The analog region 130 typically has a noise-susceptible circuit to be protected 132, such as an LNA (Low Noise Amplifier) or the like, formed therein.

The semiconductor device 100 is configured to have a substrate 102, a p-well 104 and an n-well 106 formed over the substrate 102, an impurity-diffused layer 110 and an impurity-diffused layer 112 respectively formed over the p-well 104 and the n-well 106, an element isolation insulating film 108 separating the wells or the impurity-diffused layers from each other, and an insulating interlayer 114 formed thereon. The substrate 102 may be composed of a semiconductor substrate such as silicon substrate.

The semiconductor device 100 also contains a seal ring 140 configured by a first electro-conductive film 142 buried in the insulating interlayer 114, and a guard ring 150 configured by a second electro-conductive film 152 buried in the insulating interlayer 114. The seal ring 140 is formed to have an annular geometry which surrounds an outer circumference of the digital region 120 and the analog region 130 in a plan view. In other words, the seal ring 140 is provided along the periphery of the substrate 102. The seal ring 140 may typically be configured to be provided along dicing lines on the semiconductor device 100, but not limited thereto, and may be good enough if it is configured to surround at least the digital region 120 and the analog region 130. In this embodiment, the seal ring 140 functions to prevent external moisture and so forth from intruding into the element forming region which contains the digital region 120 and the analog region 130 in the semiconductor device 100. The first electro-conductive film 142 and the second electro-conductive film 152 are formed using a metal such as copper (Cu), and may be configured as interconnects or vias formed by the single damascene process or dual-damascene process.

In this embodiment, the guard ring 150 functions to prevent noise generated in the digital region 120 from propagating to the analog region 130. The guard ring 150 is provided, in a plan view, in a region surrounded by the seal ring 140, between the digital region 120 and the analog region 130, so as to isolate the analog region 130 from the digital region 120, and is electrically connected to the seal ring 140. The seal ring 140 and the guard ring 150 are electrically connected through the first electro-conductive film 142 and the second electro-conductive film 152.

As illustrated in FIG. 2, the seal ring 140 and the guard ring 150 may be configured to be respectively connected to the substrate 102. The seal ring 140 may be configured to be provided over the entire layers of the multi-layered interconnect structure provided over the substrate 102. While the drawings illustrate the insulating interlayer 114 as a single body, the insulating interlayer 114 may alternatively be configured by a stacked structure composed of a plurality of insulating films. By providing the seal ring 140 over the entire layers of the multi-layered interconnect structure, the digital region 120 and the analog region 130 (see FIG. 1) may successfully be prevented from intrusion of external moisture or the like. While the drawings illustrate the seal ring 140 as the first electro-conductive film 142 having a single-ring configuration, the seal ring 140 may alternatively be configured using the first electro-conductive films 142 having a multiple-ring configuration.

Figure 3:
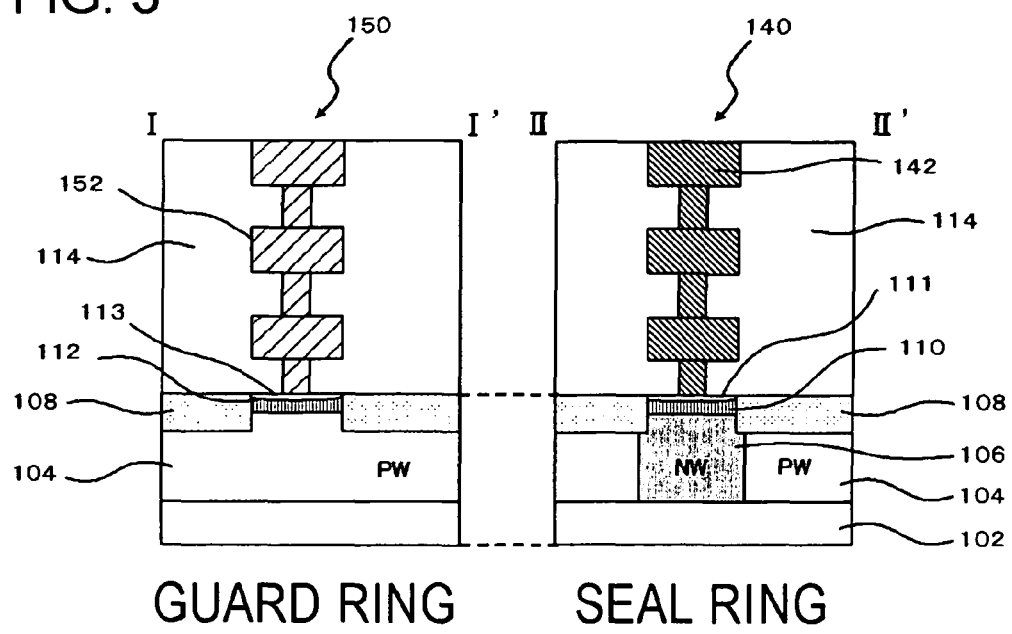
FIG. 3 is a sectional view illustrating another exemplary configuration of the semiconductor device according to the embodiment of the present invention.

The guard ring 150 may be configured to be provided only in a part of the multi-layered interconnect structure provided over the substrate 102. The guard ring 150 may alternatively be configured to be provided over the entire layers of the multi-layered interconnect structure provided over the substrate 102, as illustrated in FIG. 3, similarly to the seal ring 140.

In this embodiment, the substrate 102 may be configured to have the same conductivity type with the p-well 104, and may consequently contain a p-type impurity. Below the seal ring 140, an n-well 106 having a conductivity type opposite to that of the substrate 102 is provided. The impurity-diffused layer 110 and the impurity-diffused layer 112 may be configured using a $p^+$-type impurity-diffused layer having the same conductivity type with the substrate 102. The impurity-diffused layer 110 and the impurity-diffused layer 112 may have a silicide layer 111 and a silicide layer 113 respectively formed on the surficial portions thereof.

Figure 4:
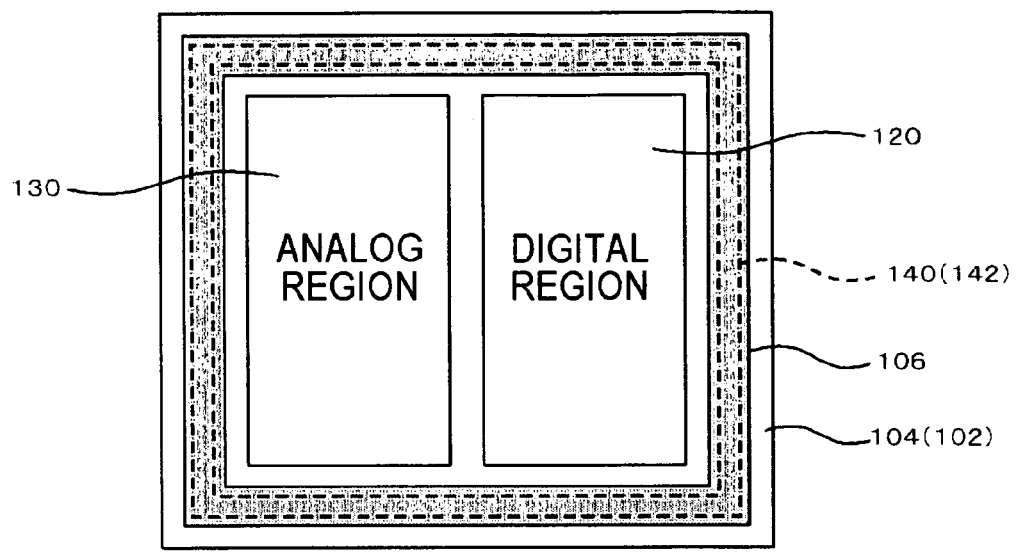
FIG. 4 is a plan view illustrating a pattern of formation of wells on a substrate in the semiconductor device according to the embodiment of the present invention.

FIG. 4 is a plan view illustrating a pattern of formation of the wells on the substrate 102, which corresponds to a section taken along line A-A' in FIG. 2. The configuration will be explained below referring to FIG. 2 to FIG. 4.

Over the n-well 106, an impurity-diffused layer 110 having the same conductivity with the substrate is formed. The seal ring 140 is electrically connected to the substrate 102 through the impurity-diffused layer 110 and the n-well 106. In this configuration, the impurity-diffused layer 110 and the n-well 106 reside between the first electro-conductive film 142 which composes the seal ring 140 and the substrate 102, while forming a p-n junctions between the impurity-diffused layer 110 and the n-well 106 and between the n-well 106 and the substrate 102. By producing such p-n junctions, impedance between the seal ring 140 and the substrate 102 grows high, due to spreading of a depletion layer at the p-n junction. Accordingly, the noise may be suppressed from propagating from the digital region 120 to the substrate 102. As a consequence, propagation of noise from the digital region 120 through the seal ring 140 and the substrate 102 to the analog region 130 may be suppressed.

On the other hand, there is no n-well 106 formed under the guard ring 150, and the second electro-conductive film 152 composing the guard ring 150 is connected to the substrate 102, without being routed through the impurity-diffused layer having a conductivity type opposite to that of the substrate 102. The second electro-conductive film 152 is connected to the substrate 102, while being routed through the impurity-diffused layer 112 having the same conductivity type with the substrate 102 and the p-well 104 having the same conductivity type with the substrate 102. In this embodiment, the substrate 102 may be configured to be grounded. By virtue of this configuration, the noise may now be dissipated also from the guard ring 150 to the substrate 102, and may therefore be prevented from propagating from the digital region 120 to the analog region 130. In this embodiment, by selectively forming the n-well only below the seal ring 140, the noise may not only be prevented from propagating from seal ring 140 to the substrate 102 in the digital region 120, but also may be dissipated from the guard ring 150 to the ground potential, and thereby the propagation of noise from the digital region 120 to the analog region 130 may effectively be suppressed.

As illustrated in FIG. 1, in the analog region 130 of the semiconductor device 100, a plurality of electrode pads 160 are provided on the top surface of the insulating interlayer 114 (see FIG. 2). Each electrode pad 160 is connected through each bonding wire 170 to each outer lead 180.

In this embodiment, out of the plurality of electrode pads 160, an electrode pad 160a (first electrode pad) disposed in the vicinity of the guard ring 150 is connected through a connection component 162a to the first electro-conductive film 142 composing the seal ring 140. The electrode pad 160a is also connected through a bonding wire 170a to an outer lead 180a which is an external grounding terminal of the semiconductor device 100. The outer lead 180a is set to the ground potential.

In this embodiment, the electrode pad 160a is disposed at a position in the vicinity of the guard ring 150, and is electrically connected through the seal ring 140 to the guard ring 150. By setting the electrode pad 160a to the ground potential in this configuration, impedance between the guard ring 150 and the electrode pad 160a may be set to a low level. Since the guard ring 150 in this embodiment is electrically connected to the seal ring 140, the electrode pad 160a is now understood to be electrically connected through the seal ring 140 to the guard ring 150. Accordingly, the noise may be dissipated not only from the seal ring 140 to the ground (ground potential), but also from the guard ring 150 to the ground in an efficient manner.

Figure 5:
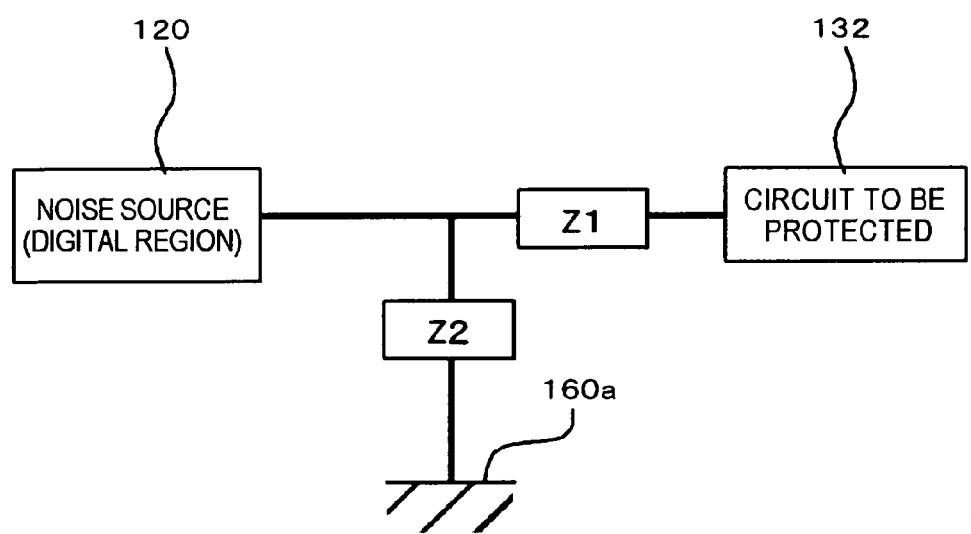
FIG. 5 is a circuit diagram schematically illustrating a configuration of the semiconductor device according to the embodiment of the present invention.

The circuit to be protected 132 may be provided apart from the digital region 120. FIG. 5 is a circuit diagram schematically illustrating a configuration of the semiconductor device 100. As illustrated in FIG. 5, if impedance Z2 between the digital region 120 as a noise source to the electrode pad 160a set to the ground potential is sufficiently smaller than impedance Z1 between the digital region 120 and the circuit to be protected 132, a signal (noise source electric power) from the digital region 120 propagates to the electrode pad 160a. On the other hand, if impedance Z2 increases, the signal otherwise possibly propagates to the circuit to be protected 132 increases.

In this embodiment, at least one of electrode pads for grounding the guard ring 150, such as electrode pad 160a, is connected to the guard ring 150 so as to set impedance Z2 which is calculated based on an electro-conduction route to the electrode pad from an intersection, where a propagation route of noise from the digital region 120 to the circuit to be protected 132 crosses the guard ring 150, to a value smaller than (for example, ½ or around of) impedance Z1 which is calculated based on the propagation route from the intersection to the circuit to be protected 132, at a predetermined frequency. The electro-conduction route from the intersection to the electrode pad herein means a route from the intersection through the second electro-conductive film 152, the first electro-conductive film 142 and so forth to the electrode pad 160a. The individual impedance values of the electro-conduction route from the intersection to the electrode pad, and of the propagation route from the intersection to the circuit to be protected 132 may be calculated typically by using simulation software such as Assura-RCX (registered trademark). In this embodiment, arrangement of the circuit to be protected 132 and arrangement of the electrode pad 160a may be determined in consideration of a result of this sort of simulation.

Another possible configuration of this embodiment may be such that another electrode pad 160 (denoted as an electrode pad 160c in the drawing) is disposed, in addition to the electrode pad 160a, in the vicinity of the circuit to be protected 132, the electrode pad 160c is then connected through the connection component 162c to the seal ring 140, and is further connected through the bonding wire 170c to the outer lead 180c which is set to the ground potential. Alternatively, the electrode pads 160 set to the ground potential may similarly be connected, at a plurality of points, respectively through the connection components 162, to the seal ring 140 or the guard ring 150. By connecting the seal ring 140 or the guard ring 150 to the ground potential through a plurality of routes, the impedance may be kept at a low level.

Figure 6:
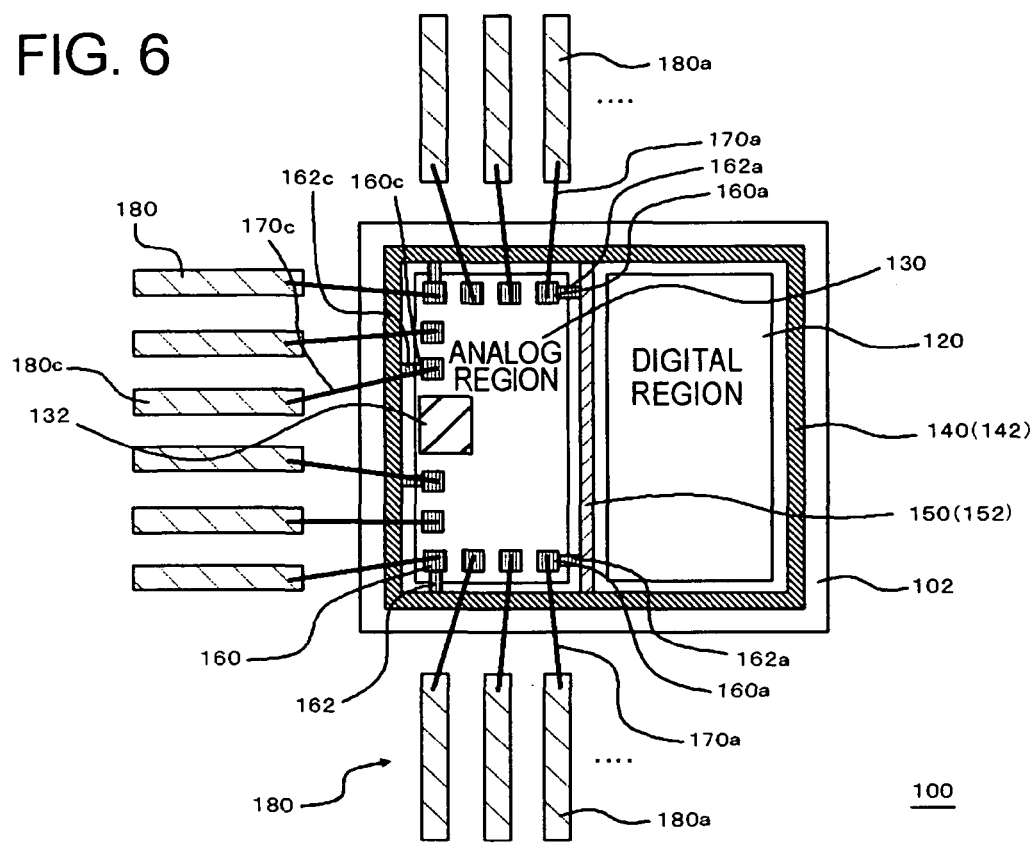
FIG. 6 is a plan view illustrating another exemplary configuration of the semiconductor device according to the embodiment of the present invention.
Figure 7:
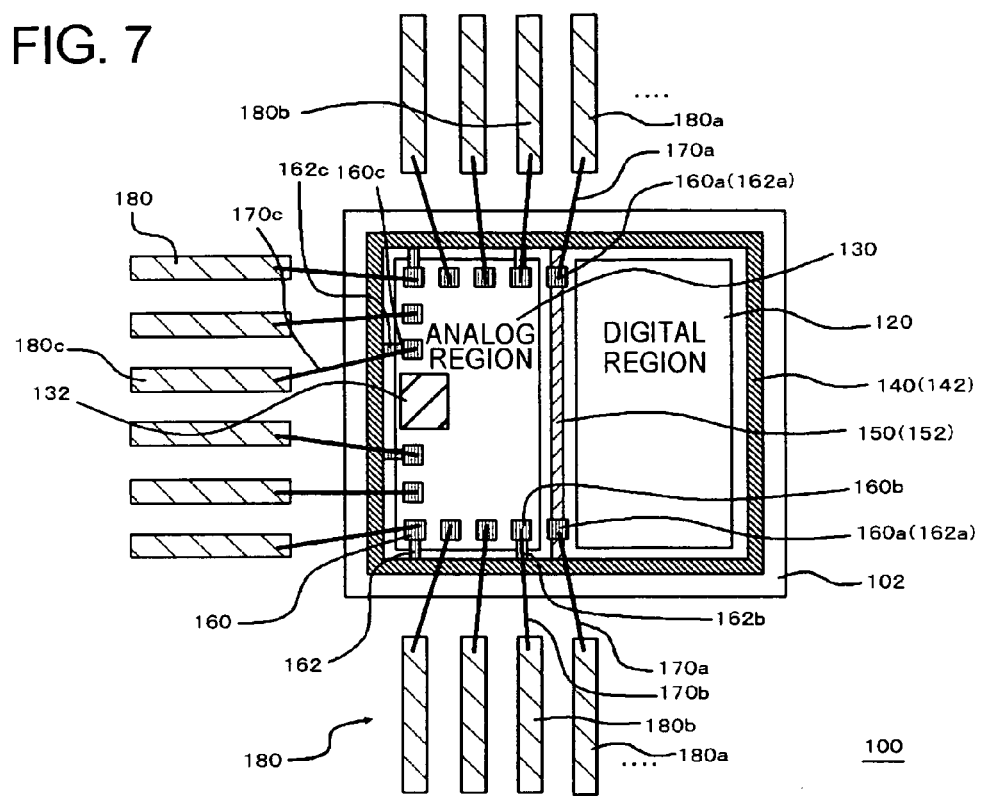
FIG. 7 is a plan view illustrating another exemplary configuration of the semiconductor device according to the embodiment of the present invention.

Still alternatively, as illustrated in FIG. 6, the electrode pad 160a may also be configured to be connected through the connection component 162a to the second electro-conductive film 152 composing the guard ring 150. Also in this case, the electrode pad 160a is connected through the bonding wire 170a to the outer lead 180a which is an external grounding terminal of the semiconductor device 100. Still alternatively, as illustrated in FIG. 7, out of the plurality of electrode pads 160, the electrode pad 160a and an electrode pad 160b, disposed in the vicinity of the guard ring 150, may be connected respectively to the second electro-conductive film 152 and the first electro-conductive film 142. Although not illustrated herein, the electrode pad 160a is electrically connected through the connection component 162a formed thereunder to the guard ring 150. In this configuration, the electrode pad 160b may be grounded while being connected through a connection component 162b to the first electro-conductive film 142, and being connected through the bonding wire 170b to a grounded outer lead 180b.

In this embodiment, the electrode pads 160 (electrode pad 160a, electrode pad 160b, electrode pad 160c and so forth) connected to the grounding terminal are connected to vias formed in the insulating interlayer 114 (see FIG. 2) at positions not overlapping points of connection with the bonding wires 170 (bonding wire 170a, bonding wire 170b, bonding wire 170c and so forth) in a plan view, and may be connected through the vias to the first electro-conductive film 142 or the second electro-conductive film 152.

Figure 8:
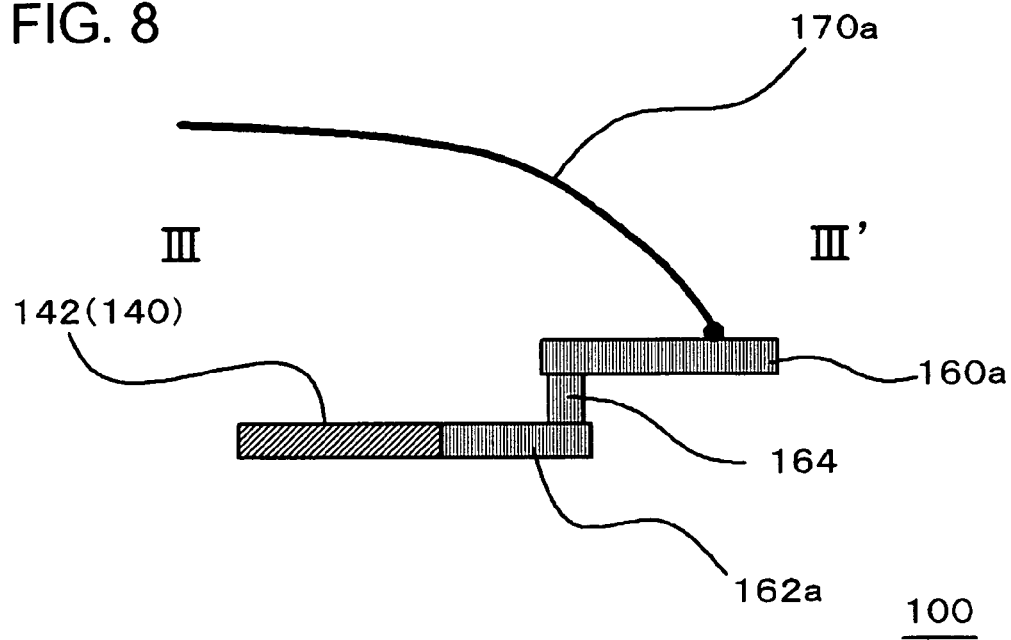
FIG. 8 is a sectional view illustrating an exemplary configuration of the semiconductor device according to the embodiment of the present invention.

FIG. 8 is a sectional view illustrating a part of layers which appear in a section taken along line in FIG. 1.

The drawing illustrates an exemplary case where the electrode pad 160a and the first electro-conductive film 142 are connected. The same will apply also to the case where any other electrode pad and the electro-conductive film are connected. Note that the connection component 162 illustrated for the explanatory purposes in the plan view of FIG. 1 may not always be provided in the same layer with the electrode pads 160, but may alternatively be provided in a layer lower than the layer having the electrode pads 160 formed therein, or in short, in a different layer from the electrode pads 160.

The electrode pad 160a is connected to a via 164 formed in the insulating interlayer 114 (not illustrated herein) at a position not overlapping a point of connection with the bonding wire 170a in a plan view. The electrode pad 160a are connected through the connection component 162a which contains the via 164 to the first electro-conductive film 142. By virtue of this configuration, even if the point of bonding on the electrode pads 160 (electrode pad 160a, electrode pad 160b, electrode pad 160c and so forth) should be damaged during wire bonding, the electrode pad 160 and the seal ring 140 and the guard ring 150 may be connected through vias while keeping the impedance at a low level. In addition, by connecting the electrode pads 160 and the seal ring 140 and the guard ring 150 through vias 164, even if crack should generate in the electrode pads 160 during wire bonding, the seal ring 140 and the guard ring 150 may be prevented from adversely affected by the crack.

Next, another example of the semiconductor device 100 of this embodiment will be explained.

Figure 9:
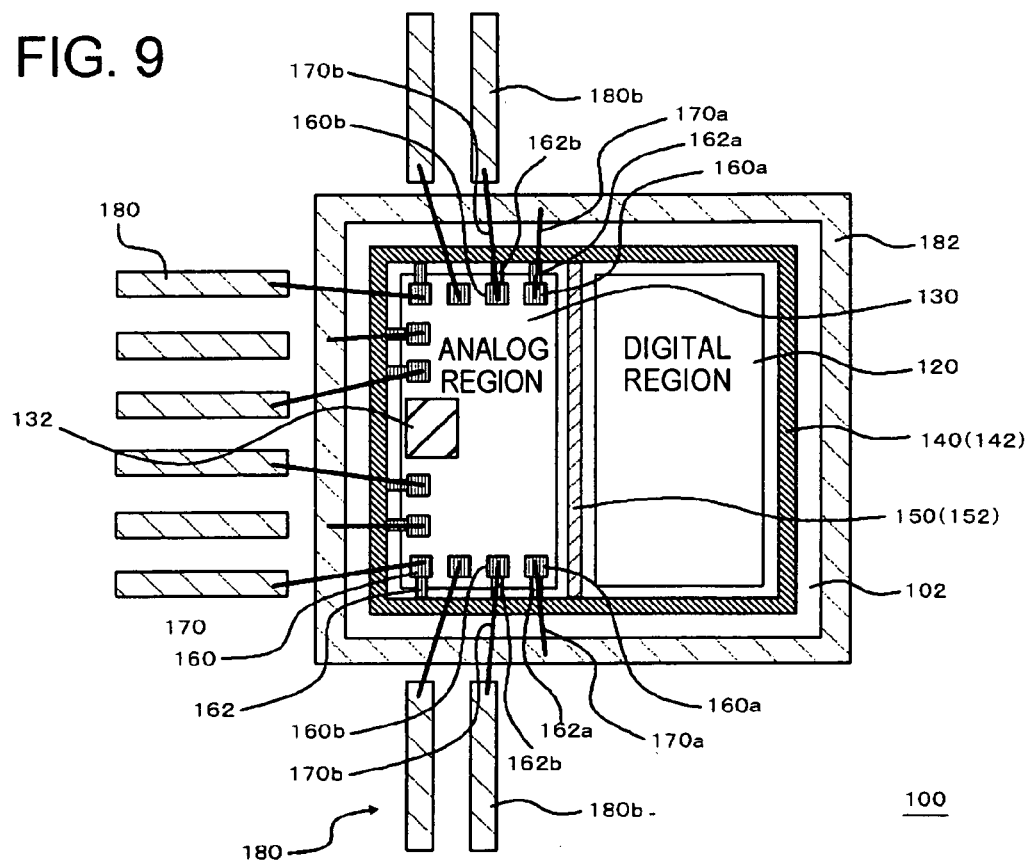
FIG. 9 is a plan view illustrating another exemplary configuration of the semiconductor device according to the embodiment of the present invention.

The grounding terminal connected to the electrode pads 160 including the electrode pad 160a, the electrode pad 160b, the electrode pad 160c and so forth, may be configured as a die pad on which the semiconductor device 100 is mounted. FIG. 9 is a plan view of the semiconductor device 100, also illustrating a die pad 182. In this example, the die pad 182 may be set to the ground potential. In this configuration, also the back surface of the substrate 102 may be electrically connected to the die pad 182, and may therefore be grounded through the die pad 182. By virtue of this configuration, the potential of the electrode pad 160a and the potential of the substrate 102 may be equalized, and thereby the guard ring 150 may stably be connected to the ground potential. Accordingly, the number of GND pins may be reduced, and the bonding length may be shortened, and thereby the electrode pad 160a may be connected to the ground potential while keeping the impedance at a low level.

Figure 10:
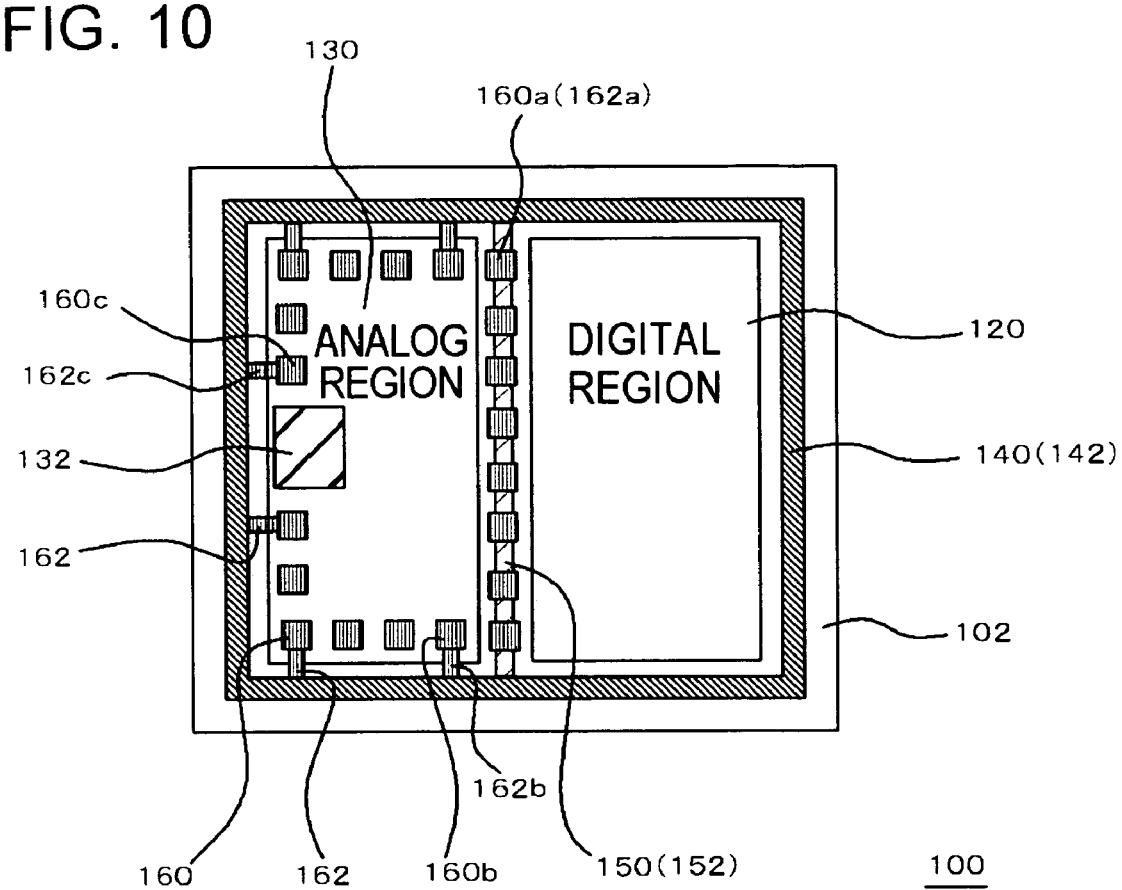
FIG. 10 is a plan view illustrating another exemplary configuration of the semiconductor device according to the embodiment of the present invention.

While the electrode pads 160, including the electrode pad 160a and so forth, in the above-described embodiments were connected through the bonding wires to the grounding terminal, the electrode pads 160 may alternatively be connected to the grounding terminal typically by flip-chip bonding, rather than wire bonding. FIG. 10 illustrates an exemplary case where the electrode pads 160 are connected to the external grounding terminals by flip-chip bonding. Since it is no longer necessary, in this configuration, to consider connection with the bonding wires 170, so that the electrode pads 160 may more readily be arranged at arbitrary positions. The electrode pad 160a may therefore be disposed typically on the guard ring 150 at the center of the semiconductor device 100. Although not illustrated, the electrode pad 160a is electrically connected through the connection component 162a formed thereunder, to the guard ring 150. Accordingly, the impedance between the electrode pad 160 and the guard ring 150 may further be reduced, and thereby the noise may be reduced.

Figure 11:
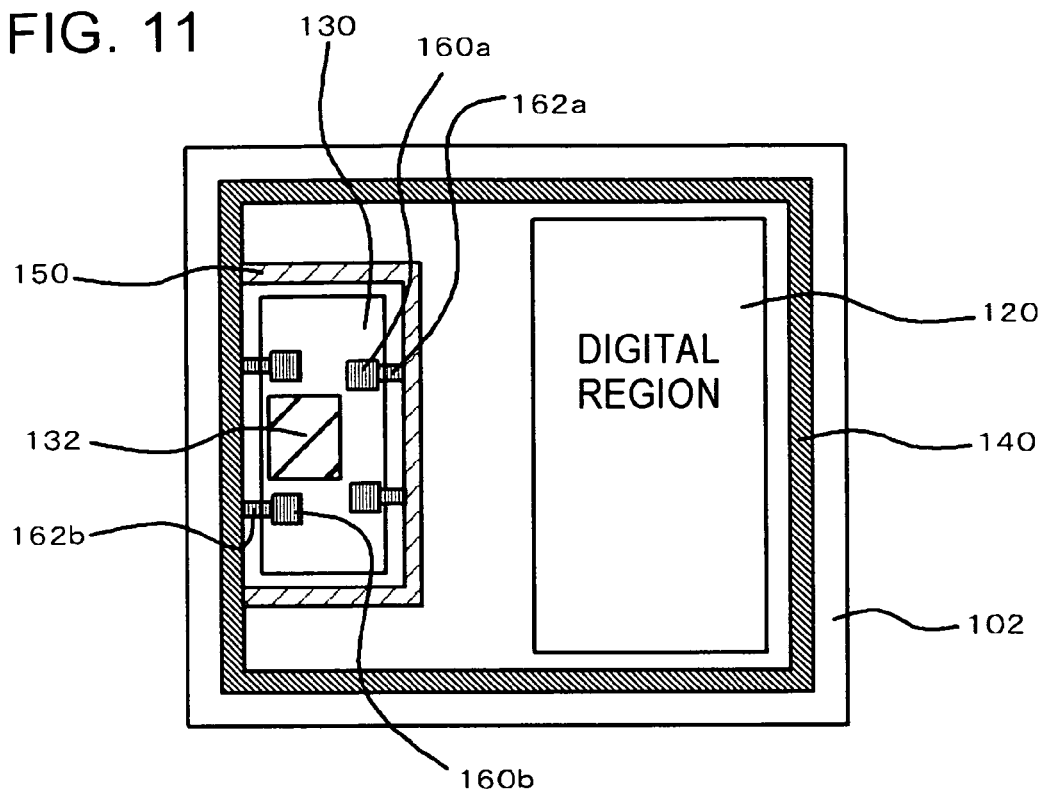
FIG. 11 is a plan view illustrating another exemplary configuration of the semiconductor device according to the embodiment of the present invention.

Alternatively, as illustrated in FIG. 11, the guard ring 150 may be configured to surround the analog region 130. Still alternatively, the guard ring 150 may be configured to surround the analog region 130 in a ring-like manner.

Next, effects of the semiconductor device 100 of this embodiment will be explained below.

According to the semiconductor device 100 of this embodiment, the guard ring 150 for isolating the analog region 130 from the digital region 120 is provided between the digital region 120 and the analog region 130, and the guard ring 150 is set to the ground potential. Accordingly, the noise otherwise possibly propagates from the digital region 120 to the analog region 130 may be dissipated to the ground. Since the electrode pad 160a set to the ground potential is electrically connected to the guard ring 150 in the vicinity thereof, so that the noise from the digital region 120 may be dissipated through the guard ring 150 while keeping the impedance at a low level, even if high-frequency signals are dealt with.

Figure 12:
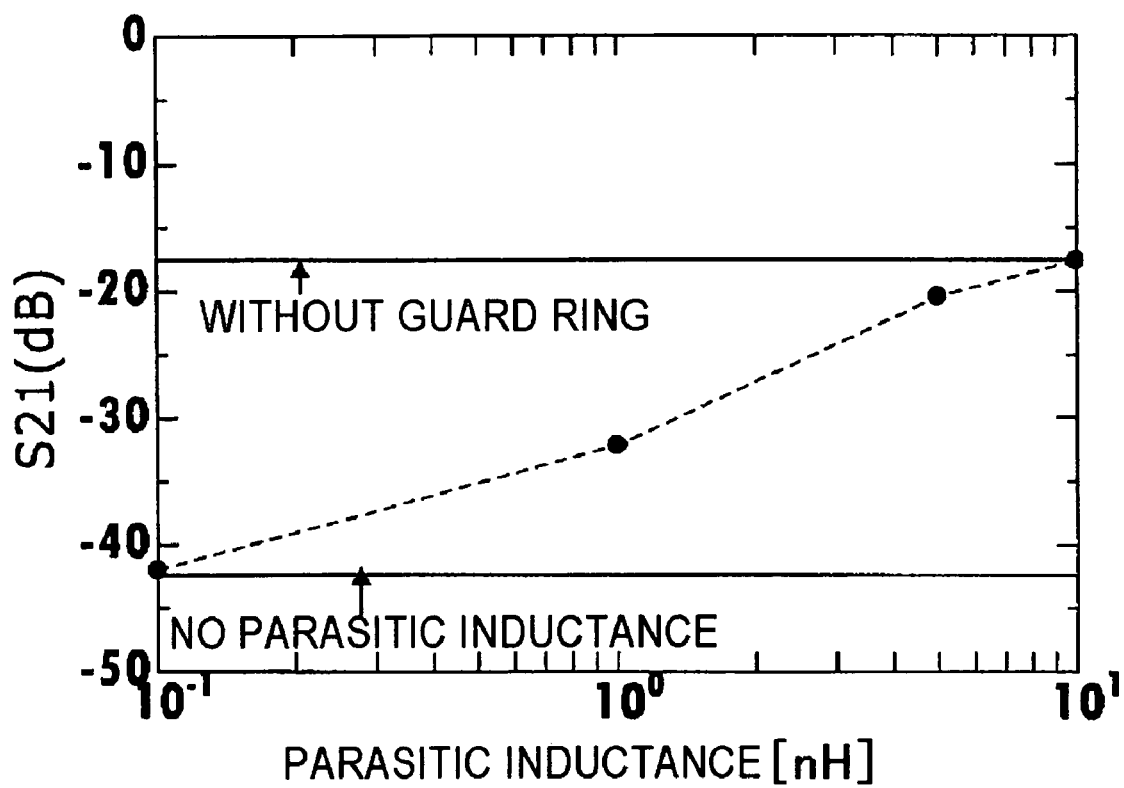
FIG. 12 is a drawing explaining an effect of the semiconductor device according to the embodiment of the present invention.

FIG. 12 is a drawing explaining the effects of the semiconductor device 100 of this embodiment. The semiconductor device 100 herein was configured similarly to as illustrated in FIG. 1, in which the guard ring was disposed between the noise source and a sensor, and an inductor was connected between the guard ring and the ground potential, at a predetermined frequency. Distance between the guard ring and the sensor was set to 0.16 µm, and distance between the noise source and the sensor was set to 50 µm. In this configuration, propagation characteristics of noise from the noise source detectable by the sensor, while varying parasitic inductance of the inductor, was calculated by simulation.

A result of simulation is given by a broken line in FIG. 12. Also a result of measurement of noise by a sensor without disposing the guard ring is given. The noise was found to propagate to the sensor even when the parasitic inductance is kept at a low level without the guard ring. It is found that the noise may be reduced to a large degree, if the guard ring is disposed and the parasitic inductance is kept not so large. The noise was found to propagate to the sensor even if the guard ring is disposed, similarly to the case having no guard ring, as the parasitic inductance of the inductor increases to a certain extent. It is therefore concluded that, in the semiconductor device 100 of this embodiment, the effect of disposition of the guard ring 150 may fully be obtained, by disposing the electrode pad 160a so as to reduce the impedance between the guard ring 150 and the electrode pad 160a.

As has been described in the above, according to the semiconductor device 100 of this embodiment, adverse influences of the noise generated in the digital region 120 otherwise possibly be exerted on the circuit to be protected 132 in the analog region 130 may be reduced, and thereby the characteristics of the circuit to be protected 132 may be prevented from degrading. Since also the seal ring 140 is electrically connected to the guard ring 150, and is consequently set to the ground potential, also influences of the noise otherwise possibly propagates through the seal ring 140 may be reduced.

The embodiments of the present invention have been described referring to the attached drawings merely for exemplary purposes, white allowing adoption of various configurations other than those described in the above.

In the above-described embodiments illustrated in FIG. 2 and FIG. 3, the n-well 106, having a conductivity type opposite to that of the substrate 102 was formed in the region having the seal ring 140 formed therein. It may alternatively be allowable to disuse the n-well 106 below the seal ring 140, and to replace the impurity-diffused layer 110 with an impurity-diffused layer having a conductivity type opposite to that of the substrate 102. Since a p-n junction may be given between the seal ring 140 and the substrate 102 also in this configuration, so that the impedance between the seal ring 140 and the substrate 102 may be kept at a high level, by virtue of spreading of a depletion layer at the p-n junction. Accordingly, the propagation of noise from the digital region 120 to the substrate 102 may be suppressed. As a consequence, the propagation of noise from the digital region 120 through the seal ring 140 and the substrate 102 to the analog region 130 may be suppressed.

While the above-described embodiments dealt with the case where the outer lead or die pad was used as the grounding terminal, the grounding terminal may be a terminal provided to an interconnect substrate such as printed wiring substrate or the like.

Although not illustrated, still another possible configuration may be such as providing the electrode pad also in the digital region 120, and connecting it to the grounding terminal.

Also in the configuration where the electrode pads 160 including the electrode pad 160a and so forth is connected through the bonding wire to the grounding terminal, the electrode pad 160 may alternatively be disposed at the center of the semiconductor device 100 typically above the guard ring 150, if such arrangement is possible.

It is apparent that the present invention is not limited to the above embodiments, that may be modified and changed without departing from the scope and spirit of the invention.

What is claimed is:

1. A semiconductor device including a digital region and an analog region embedded therein, the semiconductor device comprising:
   a substrate;
   an insulating interlayer formed over the substrate;
   a seal ring comprising a first electro-conductive film embedded in the insulating interlayer, and surrounding an outer circumference of the digital region and the analog region in a plan view;
   a guard ring comprising a second electro-conductive film embedded in the insulating interlayer, provided in an area surrounded by the seal ring, between the digital region and the analog region, so as to isolate the analog region from the digital region, and so as to be electrically connected to the seal ring; and
   a first electrode pad being electrically connected to the guard ring in the vicinity of the guard ring,
   wherein the second electro-conductive film of the guard ring is connected to the substrate, while being routed through an impurity-diffused layer having a same conductivity type as that of the substrate and a first well having a same conductivity type as the substrate, and
   wherein the first electro-conductive film of the seal ring is connected to the substrate through an impurity-diffused layer having a same conductivity type as that of the substrate and a second well having an opposite conductivity type to that of the substrate.

2. The semiconductor device as claimed in claim 1, wherein the first electrode pad is coupled to a ground terminal.

3. The semiconductor device as claimed in claim 1, wherein the first electrode pad is coupled to an external grounding terminal.

4. The semiconductor device as claimed in claim 1, wherein the first electrode pad is disposed in the vicinity of the guard ring in the analog region in a plan view.

5. The semiconductor device as claimed in claim 1, wherein the first electrode pad is connected to the first electro-conductive film or the second electro-conductive film through an electro-conductive film embedded in the insulating interlayer.

6. The semiconductor device as claimed in claim 1, wherein the first electrode pad is connected to the first electro-conductive film through an electro-conductive film embedded in the insulating interlayer, and the first electrode pad is connected to the guard ring through the seal ring.

7. The semiconductor device as claimed in claim 1, containing a plurality of the first electrode pads,
   wherein a part of the plurality of first electrode pads are respectively connected to the first electro-conductive film through an electro-conductive film embedded in the insulating interlayer, and
   other part of the plurality of first electrode pads are respectively connected to the second electro-conductive film through an electro-conductive film embedded in the insulating interlayer.

8. A semiconductor device including a digital region and an analog region embedded therein, the semiconductor device comprising:
   a substrate;
   an insulating interlayer formed over the substrate;
   a seal ring comprising a first electro-conductive film embedded in the insulating interlayer, and surrounding an outer circumference of the digital region and the analog region in a plan view;

a guard ring comprising a second electro-conductive film embedded in the insulating interlayer, provided in an area surrounded by the seal ring, between the digital region and the analog region, so as to isolate the analog region from the digital region, and so as to be electrically connected to the seal ring; and a first electrode pad being electically connected to the guard ring in the vicinity of the guard ring, wherein the second electro-conductive film of the guard ring is connected to the substrate, without being routed through an impurity-diffused layer having a conductivity type opposite to that of the substrate, and wherein the first electro-conductive film of the seal ring is connected to the substrate through an impurity-diffused layer having a same conductivity type as that of the substrate and a well having an opposite conductivity type to that of the substrate.

9. The semiconductor device as claimed in claim 1, wherein the substrate is grounded.

10. A semiconductor device including a digital region and an analog region embedded therein, the semiconductor device comprising:

a substrate;

an insulating interlayer formed over the substrate;

a seal ring comprising a first electro-conductive film embedded in the insulating interlayer, and surrounding an outer circumference of the digital region and the analog region in a plan view;

a guard ring comprising a second electro-conductive film embedded in the insulating interlayer, provided in an area surrounded by the seal ring, between the digital region, and the analog region, so as to isolate the analog region from the digital region, and so as to be electrically connected to the seal ring; and a first electrode pad being electrically connected to the guard ring in the vicinity of the guard ring, wherein the analog region includes a noise-susceptible circuit to be protected formed therein, and wherein the first electrode pad is connected to the guard ring so as to make impedance Z2 which is calculated based on an electro-conduction route to the first electrode pad from an intersection, where a propagation route of noise from the digital region to the circuit to be protected crosses the guard ring, equivalent to ½ of impedance Z1 which is calculated based on the propagation route from the intersection to the circuit to be protected, at a predetermined frequency.

11. The semiconductor device as claimed in claim 3, wherein the first electrode pad is connected to the grounding terminal through a bonding wire.

12. The semiconductor device as claimed in claim 9, wherein the first electrode pad is connected to a via formed in the insulating interlayer, at a position not overlapping a point of connection with a bonding wire in a plan view, and is connected to the first electro-conductive film or the second electro-conductive film through the via.

13. The semiconductor device as claimed in claim 3, wherein the grounding terminal comprises a terminal provided to an interconnect substrate, a die pad on which the semiconductor device is mounted, or a lead.

14. The semiconductor device as claimed in claim 3, wherein the grounding terminal comprises a die pad on which the semiconductor device is mounted, and the substrate is grounded through the die pad.

15. The semiconductor device as claimed in claim 1, wherein the analog region has a noise-susceptible circuit to be protected formed therein, and the semiconductor device further comprising:

an electrode pad electrically connected to the seal ring or the guard ring in the vicinity of the circuit to be protected, the electrode pad being set to the ground potential while being coupled to a ground terminal.

16. The semiconductor device as claimed in claim 1, wherein the analog region has a noise-susceptible circuit to be protected formed therein, and the semiconductor device further comprising:

an electrode pad electrically connected to the seal ring or the guard ring in the vicinity of the circuit to be protected, the electrode pad being set to the ground potential while being coupled to an external grounding terminal.

17. A semiconductor device including a digital region and an analog region embedded therein, the semiconductor device comprising:

a substrate;

an insulating interlayer formed over the substrate;

a seal ring comprising a first electro-conductive film embedded in the insulating interlayer, and surrounding an outer circumference of the digital region and the analog region in a plan view; and a guard ring comprising a second electro-conductive film embedded in the insulating interlayer, provided in an area surrounded by the seal ring, between the digital region and the analog region, so as to isolate the analog region from the digital region, and so as to be electrically connected to the seal ring, wherein the second electro-conductive film of the guard ring is connected to the substrate, while being routed through a first conductivity type first impurity-diffused layer and a first conductivity type well, and wherein the first electro-conductive film of the seal ring is connected to the substrate through a first conductivity type second impurity-diffused layer and a second conductivity type well.

18. The semiconductor device as claimed in claim 17, wherein the analog region has a noise-susceptible circuit to be protected formed therein, and wherein the first electrode pad is connected to the guard ring so as to make impedance Z2 which is calculated based on an electro-conduction route to the first electrode pad from an intersection, where a propagation route of noise from the digital region to the circuit to be protected crosses the guard ring, equivalent to ½ of impedance Z1 which is calculated based on the propagation route from the intersection to the circuit to be protected, at a predetermined frequency.

19. The semiconductor device as claimed in claim 17, wherein the substrate is of a first conductivity type.

20. The semiconductor device as claimed in claim 1, wherein the analog region includes a noise-susceptible circuit to be protected formed therein, and wherein the first electrode pad is connected to the guard ring according to determined impedances therebetween.

21. The semiconductor device as claimed in claim 1, further comprising a plurality of electrode pads being electrically connected to the seal ring, wherein the number of the electrode pads disposed in the analog region is more than the number of the electrode pads disposed in the digital region.

* * * * *